(12) United States Patent
Park (10) Patent No.: US 10,535,795 B2
(45) Date of Patent: Jan. 14, 2020

(54) ULTRAVIOLET LIGHT EMITTING ELEMENT AND LIGHTING SYSTEM HAVING A QUANTUM BARRIER STRUCTURE FOR IMPROVED LIGHT EMISSION EFFICIENCY

(71) Applicant: LG INNOTEK CO., LTD., Seoul (KR)

(72) Inventor: Chan Keun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 83 days.

(21) Appl. No.: 15/524,810

(22) PCT Filed: Oct. 29, 2015

(86) PCT No.: PCT/KR2015/011472
§ 371 (c)(1),
(2) Date: May 5, 2017

(87) PCT Pub. No.: WO2016/072661
PCT Pub. Date: May 12, 2016

(65) Prior Publication Data
US 2018/0261716 A1 Sep. 13, 2018

(30) Foreign Application Priority Data
Nov. 7, 2014 (KR) .................. 10-2014-0154292

(51) Int. Cl.
*H01L 33/04* (2010.01)
*H01L 33/06* (2010.01)
(Continued)

(52) U.S. Cl.
CPC .............. *H01L 33/06* (2013.01); *H01L 33/32* (2013.01); *H01L 33/48* (2013.01)

(58) Field of Classification Search
CPC .............................. H01L 33/04; H01L 33/06
See application file for complete search history.

(56) References Cited

U.S. PATENT DOCUMENTS

| | | | | |
|---|---|---|---|---|
| 2005/0067613 A1* | 3/2005 | Kim | ...................... | B82Y 20/00 257/14 |
| 2008/0089376 A1* | 4/2008 | Anan | .................. | H01S 5/18311 372/46.013 |

(Continued)

FOREIGN PATENT DOCUMENTS

| | | |
|---|---|---|
| JP | 2009-253164 A | 10/2009 |
| JP | 2012-234891 A | 11/2012 |

(Continued)

*Primary Examiner* — Shaun M Campbell
*Assistant Examiner* — Suberr L Chi
(74) *Attorney, Agent, or Firm* — Birch, Stewart, Kolasch & Birch, LLP (57) ABSTRACT

An embodiment relates to a light emitting element, a method for manufacturing a light emitting element, a light emitting element package, and a lighting system. An ultraviolet light emitting element according to an embodiment may comprise: a first conductivity type semiconductor layer (112); an active layer (114) comprising a quantum barrier (114B) and a quantum well (114W), the active layer (114) being arranged on the first conductivity type semiconductor layer (112); and a second conductivity type semiconductor layer (116) on the active layer (114). The quantum barrier (114B) may comprise an undoped $Al_xGa_{1-x}N$ layer ($0 \le x \le 1$) (114BU) and an n-type $Al_yGa_{1-y}N$ layer ($0 \le y \le 1$) (114BN).

15 Claims, 8 Drawing Sheets

(51) Int. Cl.
*H01L 33/32* (2010.01)
*H01L 33/48* (2010.01)

(56) References Cited

U.S. PATENT DOCUMENTS

2008/0308787 A1 12/2008 Lee et al.
2009/0258452 A1 10/2009 Enya et al.
2012/0273758 A1 11/2012 Komada

FOREIGN PATENT DOCUMENTS

| KR | 10-0875444 B1 | 12/2008 |
| KR | 10-2013-0103070 A | 9/2013 |
| KR | 10-2014-0013249 A | 2/2014 |
| KR | 10-2014-0041225 A | 4/2014 |

\* cited by examiner

ULTRAVIOLET LIGHT EMITTING ELEMENT AND LIGHTING SYSTEM HAVING A QUANTUM BARRIER STRUCTURE FOR IMPROVED LIGHT EMISSION EFFICIENCY

CROSS REFERENCE TO RELATED APPLICATIONS

This application is the National Phase of PCT International Application No. PCT/KR2015/011472, filed on Oct. 29, 2015, which claims priority under 35 U.S.C. 119(a) to Patent Application No. 10-2014-0154292, filed in Republic of Korea on Nov. 7, 2014, all of which are hereby expressly incorporated by reference into the present application.

TECHNICAL FIELD

The present invention relates to a light emitting device, a method of fabricating the same, a light emitting device package, and a lighting system.

BACKGROUND ART

A light emitting device includes a P-N junction diode having a characteristic of converting electrical energy into light energy. The light emitting device may be fabricated with compound semiconductors belonging to group III and V on the periodic table. The LED can produce various colors by adjusting the compositional ratio of the compound semiconductors.

When forward voltage is applied to the light emitting device, electrons of an N layer are combined with holes of a P layer, so that energy corresponding to an energy bandgap between a conduction band and a valance band may be generated. In the case of the light emitting device, the energy is generated in the form of light.

For example, a nitride semiconductor represents higher thermal stability and wide bandgap energy so that the nitride semiconductor has been spotlighted in the field of optical devices and high-power electronic devices. Specifically, blue light emitting devices, green light emitting devices, ultraviolet (UV) light emitting devices, and the like using nitride semiconductors are commercialized and widely used.

According to the light emitting device of the related art, an active layer serving as a light emitting layer is formed by repeatedly laminating a quantum well having a lower energy bandgap and a quantum barrier having a higher energy bandgap. In the quantum well, electrons injected through an N type semiconductor layer meet and are combined with holes injected through a P type semiconductor layer, thereby emitting light.

Meanwhile, according to the related art, a light emitting device has a droop problem in which light emission efficiency is lowered as the quantity of applied current is increased. This is because the efficiency of carrier (holes or electrons) injection into a light emitting layer is not uniform. In order to solve the above problem, there is required the development of a technique of substantially participating most quantum wells of the light emitting layer in light emission.

Recently, an ultraviolet light emitting device (UV LED) has been spotlighted in the use for sterilizing, purifying, or the like, or the use for exposure machine, curing machine, or the like. There is required a technique of increasing light emission efficiency of the UV LED by taking into consideration that the UV LED has a lower composition of indium (In) in a quantum well as compared to that of a light emitting device in a visible light region such as a blue light emitting device.

DISCLOSURE

Technical Problem

The embodiment is to provide an ultraviolet light emitting device, capable of improving light emission efficiency, a method of fabricating a light emitting device, a light emitting device package, and a lighting system.

Technical Solution

According to the embodiment, an ultraviolet light emitting device may include a first conductivity type semiconductor layer (112), an active layer (114) including a quantum barrier (114B) and a quantum well (114W) and provided on the first conductivity type semiconductor layer (112); and a second conductivity type semiconductor layer (116) on the active layer (114). The quantum barrier (114B) includes undoped $Al_xGa_{1-x}N$ layers ($0 \le x \le 1$) (114BU) and an N type $Al_yGa_{1-y}N$ layer ($0 \le y \le 1$) (114BN).

In addition, according to the embodiment, an ultrasonic light emitting device may include a first conductivity type semiconductor layer (112); an active layer (114) including a quantum barrier (114B) and a quantum well (114W) and provided on the first conductivity type semiconductor layer (112); and a second conductivity type semiconductor layer (116) on the active layer (114). The quantum barrier (114B) includes undoped $Al_xGa_{1-x}N$ layers ($0 \le x \le 1$) (114BU), an N type $Al_yGa_{1-y}N$ layer ($0 \le y \le 1$) (114BN), and a first quantum barrier (114BI) closest to the first conductivity type semiconductor layer (112). The undoped $Al_xGa_{1-x}N$ layers (114BU) may be provided at both sides of the N type $Al_yGa_{1-y}N$ layer (114BN) in the quantum barrier (114B). The quantum well (114W) may include a last quantum well (114WL) closest to the second conductivity type semiconductor layer (116), and a second quantum well (114W) that is one of quantum wells which are not be closest to the second conductivity type semiconductor layer (116).

According to the embodiment, the light emitting device package may include the ultrasonic light emitting device.

Advantageous Effects

The embodiment may provide an ultraviolet light emitting device having improved light emission efficiency, a method of fabricating a light emitting device, a light emitting device package, and a lighting system.

BEST MODE

Mode for Invention

In the description of the embodiments, it will be understood that, when a layer (or film), a region, a pattern or structures are referred to as being "on" or "under" a substrate, another layer (film), another region, another pad, or other patterns, they can be "directly" or "indirectly" on the other layer (or film), region, pad, or patterns, or one or more intervening layers may also be present. Such a position of each layer has been described with reference to the drawings.

Embodiment

Figure 1:
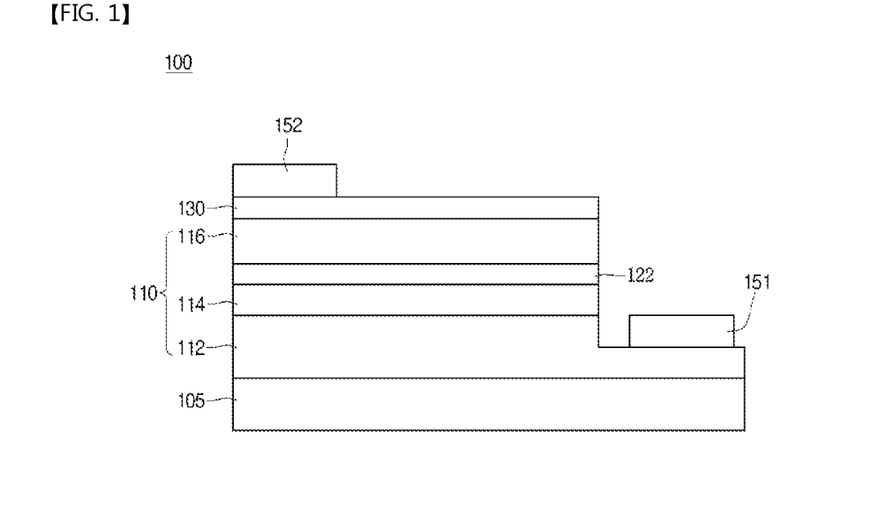
FIG. 1 is a cross-sectional view of a light emitting device according to the embodiment.

FIG. 1 is a cross-sectional view of a light emitting device 100 according to the embodiment.

According to the embodiment, the light emitting device 100 may include a first conductivity type semiconductor layer 112, an active layer 114 including a quantum barrier 114B and a quantum well 114W and provided on the first conductive layer 112, and a second conductivity type semiconductor layer 116 provided on the active layer 114.

According to the embodiment, an $Al_pGa_qIn_{1-p-q}N$ ($0<p\leq 1$, $0\leq q\leq 1$) 122 is interposed between the active layer 114 and the second conductivity type semiconductor layer 116 to block electrons, thereby improving light emission efficiency.

According to the embodiment, a transmissive electrode 130 may be provided on the second conductivity type semiconductor layer 116, and the second conductivity type semiconductor layer 116 and the first conductivity type semiconductor layer 112 may include a second electrode 152 and a first electrode 151, respectively, which are electrically connected with each other.

According to the embodiment, as shown in FIG. 1, a lateral-type light emitting device may be provided in which a light emitting structure 110 is provided on a substrate 105, but the embodiment is not limited thereto. For example, a vertical-type light emitting device may be provided.

Figure 2:
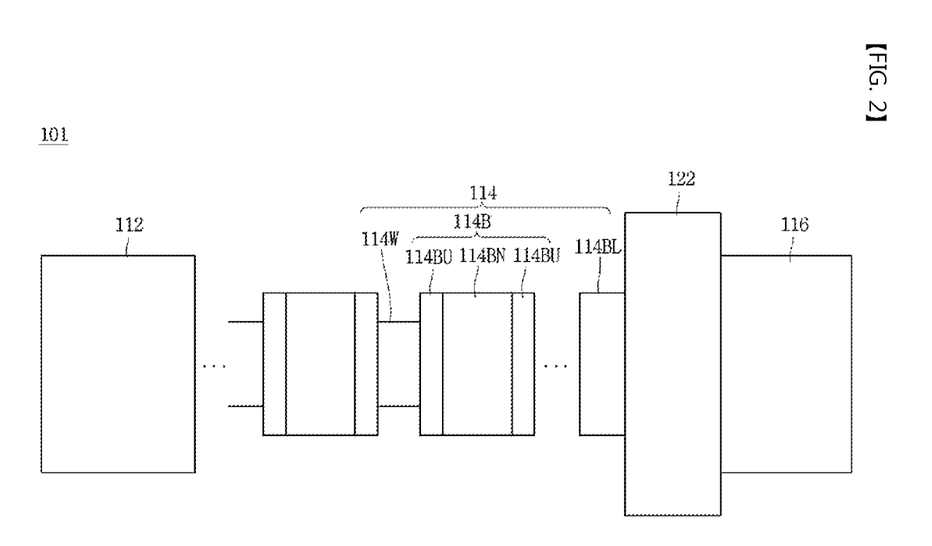
FIG. 2 is a band diagram of a light emitting device according to a first embodiment.

FIG. 2 is a band diagram of a light emitting device 101 according to a first embodiment.

According to the related art, if a quantum well Qw is grown with a thick thickness to widen an active area for the purpose of improving light emission efficiency in a blue LED, Indium (In) having a higher lattice constant causes a lattice constant difference, and thus a piezoelectric effect is produced. Accordingly, a quantum confined stark effect (QCSE) is produced and thus light intensity is lowered.

Meanwhile, differently from the blue LED, an UV LED has a lower In concentration in a quantum well. Therefore, since the piezoelectric effect may be rarely produced due to the lattice constant difference, an active layer may be grown with a thicker thickness to widen the active area.

However, actually, most light emission is performed in the last well closest to the second conductivity type semiconductor layer 116. In the case of the UV LED, as the thickness of the quantum well in the active layer is increased, the whole volume of the quantum well is widened, thereby lowering the efficiency of carrier injection into the last quantum well, for example, the efficiency of electron injection.

Therefore, the first embodiment may provide a light emitting device having light emission efficiency improved by increasing the light intensity as the active area is widened due to the thick quantum well to improve the carrier injection efficiency.

To this end, according to the first embodiment, the quantum barrier 114B may include undoped $Al_xGa_{1-x}N$ layers ($0\leq x\leq 1$) 114BU and an N type $Al_yGa_{1-y}N$ layer ($0\leq y\leq 1$) 114BN.

The undoped $Al_xGa_{1-x}N$ layers ($0\leq x\leq 1$) may be provided at both sides of the N type $Al_yGa_{1-y}N$ layer 114BN.

For example, according to the first embodiment, the structure of quantum barriers 114B other than the last quantum wall 114BL closest to the second conductivity type semiconductor layer 116 may include the structure of the undoped $Al_xGa_{1-x}N$ layer 114BU/N type $Al_yGa_{1-y}N$ layer 114BN/undoped $Al_xGa_{1-x}N$ layer 114BU, but the embodiment is not limited thereto. Hereinafter, the first embodiment will be more described.

The undoped $Al_xGa_{1-x}N$ layer 114BU may have an aluminum (Al) concentration (x) satisfying $0.1\leq x\leq 0.2$. If the Al concentration (x) of the undoped $Al_xGa_{1-x}N$ layer 114BU is less than 0.1, the undoped $Al_xGa_{1-x}N$ layer 114BU may not serve as a barrier due to carrier overflow. If the Al concentration x of the undoped $Al_xGa_{1-x}N$ layer 114BU exceeds 0.2, the injection efficiency of carriers (electrons or holes) may be lowered.

The thickness of the undoped $Al_xGa_{1-x}N$ layer 114BU may be in the range of about 1 nm to 5 nm, but the embodiment is not limited thereto. If the thickness of the undoped $Al_xGa_{1-x}N$ layer 114BU is less than 1 nm, the quality of the interfacial surface between the quantum well/quantum barrier is degraded due to N type doping elements, such as Si, doped into the adjacent N type $Al_yGa_{1-y}N$ layer 114BN. Accordingly, light loss may be caused due to non-recombination. If the thickness of the undoped $Al_xGa_{1-x}N$ layer 114BU exceeds 5 nm, the efficiency of the electron injection into the quantum well may be lowered.

Next, the N type $Al_yGa_{1-y}N$ layer 114BN may have Al concentration (y) satisfying $0.05\leq y\leq 0.2$. If the Al concentration y of the N type $Al_yGa_{1-y}N$ layer 114BN is less than 0.05, the N type $Al_yGa_{1-y}N$ layer 114BN may not serve as a barrier. If the Al concentration y of the N type $Al_yGa_{1-y}N$ layer 114BN exceeds 0.2, the injection efficiency of carriers (holes or electrons) may be lowered.

According to the embodiment, the N type $Al_yGa_{1-y}N$ layer 114BN may be doped with N type dopants in the modulation form. Accordingly, the N type $Al_yGa_{1-y}N$ layer 114BN may include a repeated structure of an u-$Al_aGa_{1-a}N$ layer ($0\leq a\leq 1$) (not shown)/n-$Al_bGa_{1-b}N$ layer (1311) (not shown).

The u-$Al_aGa_{1-a}N$ layer ($0\leq a\leq 1$) (not shown)/n-$Al_bGa_{1-b}N$ layer ($0\leq b\leq 1$) (not shown) may have the thickness in the range of about 1 nm to 2 nm, but the embodiment is not limited thereto.

The doping level of N type doping elements in the n-$Al_bGa_{1-b}N$ layer ($0\leq b\leq 1$) may be in the range of about $2\times 10^{18}$ to about $6\times 10^{18}$. If the doping concentration is less than the minimum value, the light intensity Po and operating voltage VF3 may be lowered. If the doping concentration exceeds the maximum value, the loss of the light intensity Po may be caused due to the degradation in the quality of the quantum well.

The thickness of the N type $Al_yGa_{1-y}N$ layer 114BN may be in the range of about 2 nm to about 15 nm, but the embodiment is not limited thereto. If the thickness of the N type $Al_yGa_{1-y}N$ layer 114BN is less than 2 nm, the light loss may be caused due to electron overflow, and thus the function as the barrier may be affected. If the thickness of the N type $Al_yGa_{1-y}N$ layer 114BN exceeds 15 nm, the injection efficiency of carriers may be lowered.

According to the first embodiment, the thickness of the quantum barrier 114B including the undoped $Al_xGa_{1-x}N$ layer 114BU/N type $Al_yGa_{1-y}N$ layer 114BN/undoped $Al_xGa_{1-x}N$ layer 114BU may be in the range of about 4 nm to about 20 nm. If the thickness of the quantum barrier 114 is less than 4 nm, the function as the barrier may be affected due to the carrier overflow. If the thickness of the quantum barrier 114 exceeds 20 nm, the injection efficiency of carriers may be degraded.

TABLE 1

|  | Light intensity (Po, mW) | Operating voltage (VF3, V) |
| --- | --- | --- |
| Comparative example | 428 | 4.15 |
| First embodiment | 537 | 3.51 |

Table 1 shows the comparison in the light intensity and the operating voltage between the comparative example and the first embodiment.

According to the comparative example, there is provided an UV LED having a quantum well of about 9 nm and a Si-undoped quantum barrier of about 7 nm. According to the first embodiment, there is provided an UV LED having the quantum well of about 9 nm and a Si-doped quantum barrier of about 14 nm.

According to the first embodiment, the quantum barrier 114B has the structure of the undoped $Al_xGa_{1-x}N$ layer 114BU/N type $Al_yGa_{1-y}N$ layer 114BN/undoped $Al_xGa_{1-x}N$ layer 114BU. Therefore, the efficiency of the carrier injection into the last quantum well emitting most light may be improved, so that the light intensity (Po) and the operating voltage (VF3) may be improved.

In addition, according to the first embodiment, electron mobility is increased by modulation Si doping, so that the carrier injection efficiency is more improved, thereby significantly improving the light intensity (Po) and the operating voltage (VF3).

Figure 3:
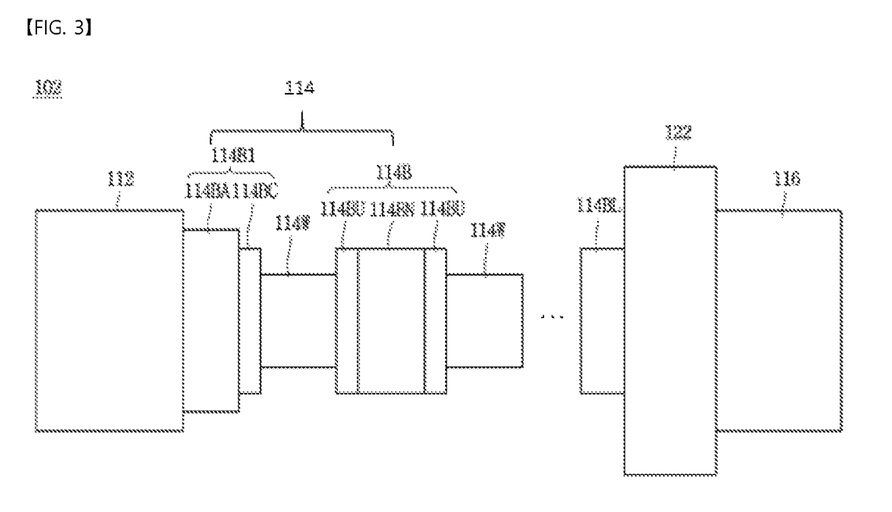
FIG. 3 is a band diagram of a light emitting device according to a second embodiment.

FIG. 3 is a band diagram of a light emitting device according to a second embodiment.

The second embodiment may employ the technical features of the first embodiment.

According to the second embodiment, the structure of a first quantum barrier 114B1 closest to the first conductivity type semiconductor layer 112 is improved to improve current spreading, and the electric characteristic may be improved through the electron cooling effect in the high current area.

According to the second embodiment, the first quantum barrier 114B1 closest to the first conductivity type semiconductor layer 112 of the quantum barrier 114B may include an N type $Al_pGa_{1-p}N$ layer ($0 \leq p \leq 1$) 114BA and an undoped $Al_qGa_{1-q}N$ layer ($0 \leq q \leq 1$) 114BC.

The N type $Al_pGa_{1-p}N$ layer 114BA may be closer to the first conductivity type semiconductor layer 112 than the undoped $Al_qGa_{1-q}N$ layer 114BC.

The undoped $Al_qGa_{1-q}N$ layer 114BC may be provided adjacent to the quantum well 114W than the N type $Al_pGa_{1-p}N$ layer 114BA.

The Al concentration (p) of the N type $Al_pGa_{1-p}N$ layer ($0 \leq p \leq 1$) 114BA may be higher than the Al concentration (q) of the undoped $Al_qGa_{1-q}N$ layer ($0 \leq q \leq 1$) 114BC.

For example, the Al concentration (p) of the N type $Al_pGa_{1-p}N$ layer 114BA may be higher than the Al concentration (q) of the undoped $Al_qGa_{1-q}N$ layer 114BC, and the Al concentrations of the layers may be controlled to satisfy the range of $0.07 \leq q < p \leq 0.2$. In more detail, when the Al concentration of the quantum is in the range of $0.1 \leq q < p \leq 0.18$, more excellent effects may be produced. However, the embodiment is not limited to the Al concentration.

Meanwhile, if the Al concentration (p) of the N type $Al_pGa_{1-p}N$ layer 114BA is less than the Al concentration (q) of the undoped $Al_qGa_{1-q}N$ layer 114BC, a current spreading effect may be degraded.

If the Al concentration (q) of the undoped $Al_qGa_{1-q}N$ layer 114BC is less than 0.07, the current spreading effect may be degraded. If the Al concentration (p) of the N type $Al_pGa_{1-p}N$ layer 114BA exceeds 0.2, the carrier injection efficiency may be degraded, thereby increasing the operating voltage VF3 and causing the light loss.

The N type $Al_pGa_{1-p}N$ layer 114BA may be doped with N type dopants, for example, Si. Meanwhile, when the undoped $Al_qGa_{1-q}N$ layer 114BC is doped with Si, a low current yield and a current spreading effect may be lowered. Meanwhile, the expression of the undoped $Al_qGa_{1-q}N$ layer 114BC implies that intentional N type doping is not performed, but N type elements diffused from another layer are not excluded.

In the N type $Al_pGa_{1-p}N$ layer 114BA, the doping range of N type dopants, for example, Si is in the range of about $1 \times 10^{18}$ to about $2 \times 10^{19}$. In more detail, the doping range, which is in the range of about $2 \times 10^{18}$ to about $7 \times 10^{18}$, is more effective, but the embodiment is not limited thereto.

In the N type $Al_pGa_{1-p}N$ layer 114BA, if the concentration of the N type dopants is less than $1 \times 10^{18}$, carrier injection may not be smoothly performed. If the concentration of the N type dopants exceeds $2 \times 10^{19}$, the yield rate and the electric characteristic may be degraded due to excessive doping.

The thickness of the N type $Al_pGa_{1-p}N$ layer 114BA may be in the range of about 5 nm to about 20 nm. In more detail, the thickness, which is in the range of about 10 nm to about 15 nm, may be more effective. If the thickness of the N type $Al_pGa_{1-p}N$ layer 114BA is less than 5 nm, a current spreading effect may be degraded. If the thickness of the N type $Al_pGa_{1-p}N$ layer 114BA exceeds 20 nm, carrier injection is not sufficiently performed, thereby causing light loss or increasing the operating voltage VF3.

The thickness of the undoped $Al_qGa_{1-q}N$ layer 114BC may be in the range of about 2 nm to about 7 nm. In more detail, the thickness of the undoped $Al_qGa_{1-q}N$ layer 114BC, which is in the range of about 3 nm to about 5 nm, is more effective. If the thickness of the undoped $Al_qGa_{1-q}N$ layer 114BC is less than 2 nm, the current spreading effect may be degraded. If the thickness of the undoped $Al_qGa_{1-q}N$ layer 114BC exceeds 7 nm, problems may be caused in carrier injection.

Figure 4A:
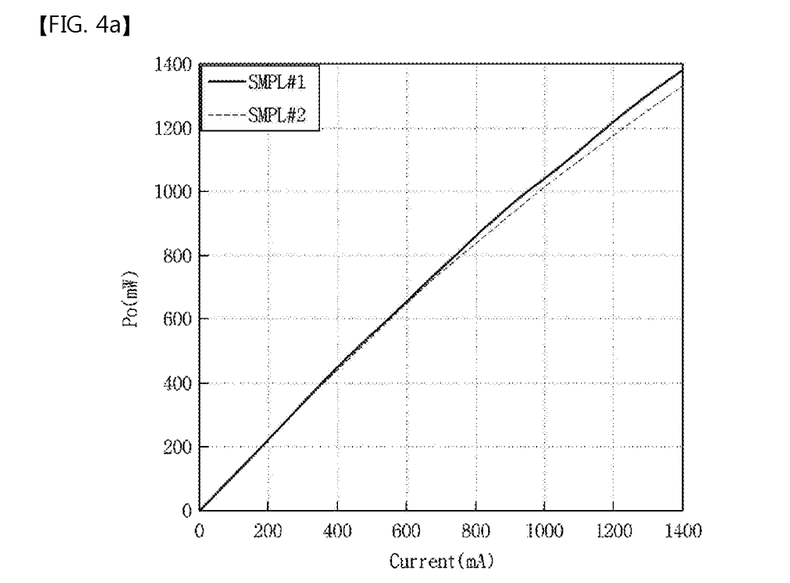
FIGS. 4A and 5B are electrical characteristic data light emitting devices according to the comparative example and the second embodiment.
Figure 5A:
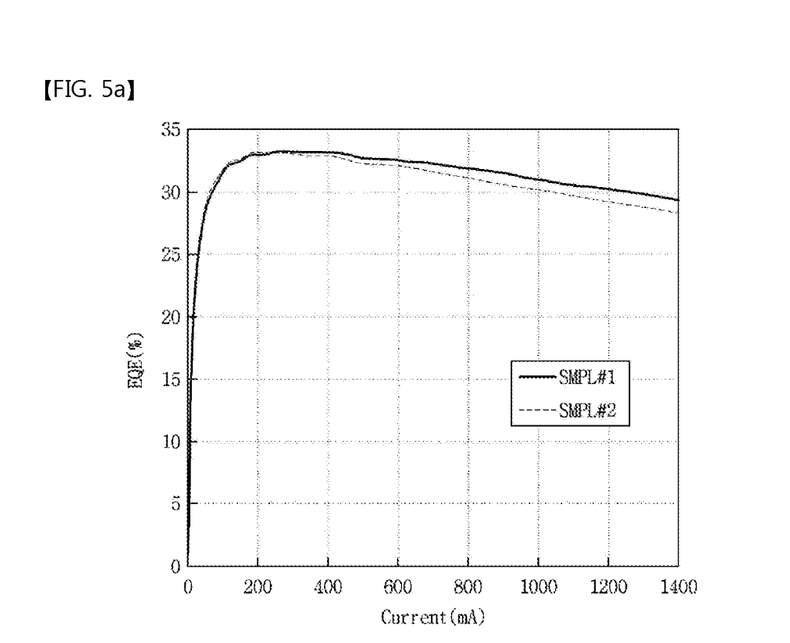
Figure 5B:
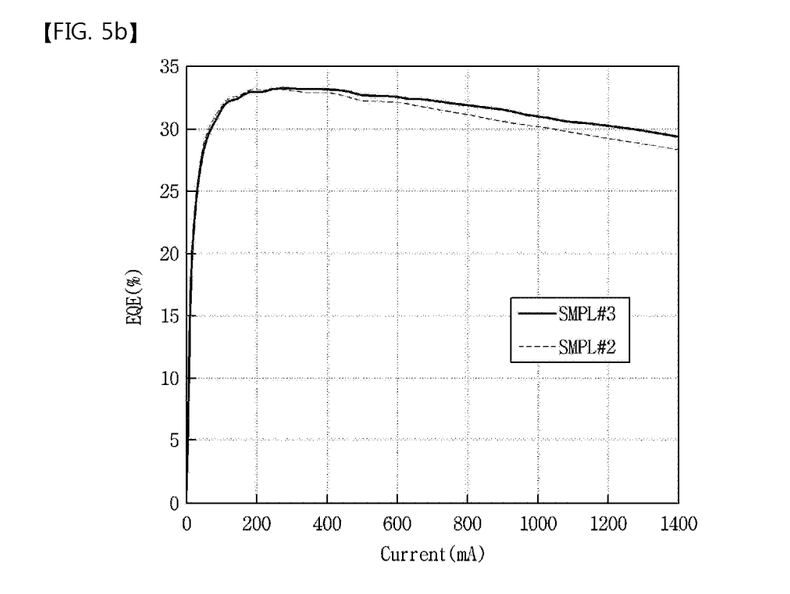

FIGS. 4A and 5B are electrical characteristic data of light emitting devices according to the comparative example and the second embodiment.

Figure 4B:
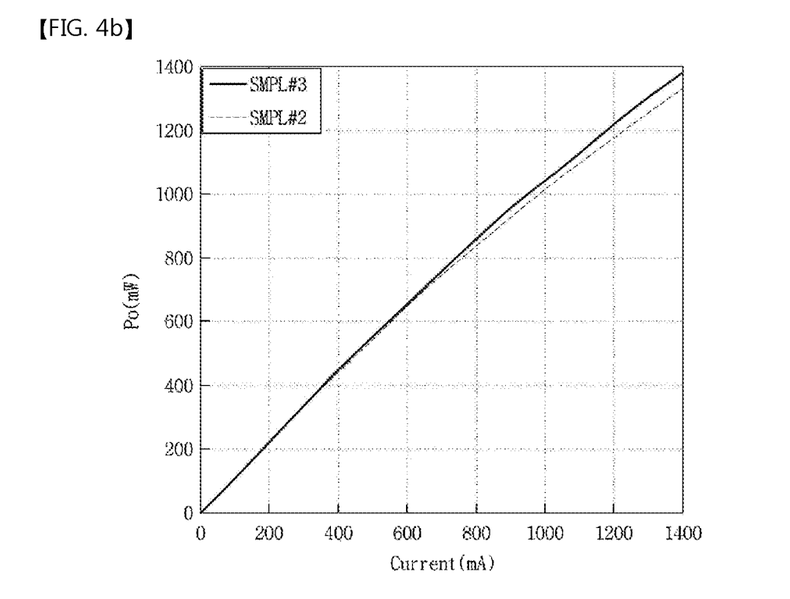

As shown in FIGS. 4A and 4B, the second embodiment (SMPL#1, SMPL#3) is increased in light intensity (Po) as compared to the comparative example (SMPL#2). The SMPL#3 according to the second embodiment are reproduction data obtained by reproducing the second embodiment. In FIG. 4B, the SMPL#3 (bold line), which serves as the reproduction data, is matched with data of the SMPL#1 (bold line).

In addition, as shown in FIGS. 5A and 5B, in the second embodiment (SMPL#1, SMPL#3), internal quantum efficiency (EQE) and the droop phenomenon are significantly improved as compared to the comparative example SMPL#2.

Figure 6:
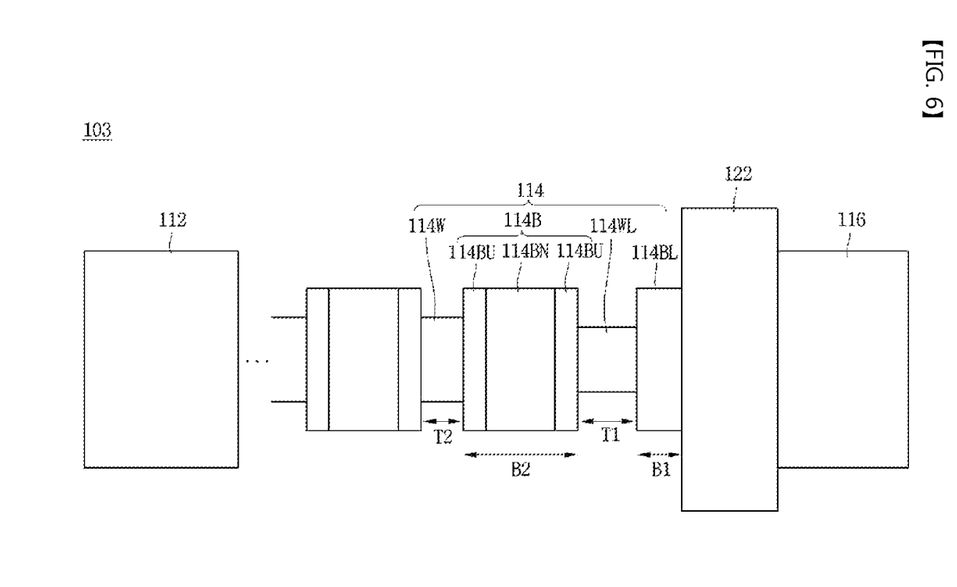
FIG. 6 is a band diagram of a light emitting device according to a third embodiment.

FIG. 6 is a band diagram of a light emitting device according to a third embodiment.

The third embodiment may employ the technical feature of the first embodiment or the second embodiment.

In a light emitting device 103 according to the third embodiment, a quantum well 114W may include the last quantum well 114WL, which is closest to the second conductivity type semiconductor layer 116, and a second quantum well 114W which is any one of quantum wells not closest to the second conductivity type semiconductor layer 116.

According to the light emitting device 103 of the third embodiment, bandgap energy is controlled such that light emitted from the last quantum well 114WL is not absorbed into another quantum well.

For example, according to the third embodiment, the last quantum well 114WL may include the composition of an $In_rGa_{1-r}N$ layer ($0 \leq r \leq 1$), and the second quantum well 114W may include the composition of an $In_sGa_{1-s}N$ layer ($0 \leq s \leq 1$). The In concentration (r) of the last quantum well 114WL may be higher than the In concentration (s) of the second quantum well 114W.

The In compositions of the last quantum well 114WL and the second quantum well 114W may be in the range of $0 \leq r < s \leq 0.015$. In more detail, the In composition (r) of the last quantum well 114WL may be in the range of $0.005 \leq r \leq 0.007$, and the In composition (s) of the second quantum well 114W may be in the range of $0.01 \leq s \leq 0.015$, but the embodiment is not limited thereto.

If the In composition(s) of the second quantum well 114W exceeds 0.015, a dual peak may occur or the wavelength may be increased to more than 370 nm.

If In composition (r) of the last quantum well 114WL is equal to the In composition (s) of the second quantum well 114W, the light emitted from the last quantum well 114WL may be absorbed into another quantum well, thereby causing light loss.

Therefore, in the light emitting device 103 according to the embodiment, bandgap energy may be controlled such that the light emitted from the last quantum well 114WL is not absorbed into another quantum well.

In the light emitting device 103 according to the third embodiment, an active area is more widened in the last quantum well 114WL closest to the second conductivity type semiconductor layer 116 which emits most light.

For example, according to the third embodiment, the thickness T1 of the last quantum well 114WL may be thicker than the thickness T2 of the second quantum well 114W.

The relation between the thickness T1 of the last quantum well 114WL and the thickness T2d of the second quantum well 114W satisfy 3 nm≤T2<T1<15 nm. In detail, the relation of the thickness of 7 nm≤T2<T1<12 nm may be more effective.

If the thickness T2 of the second quantum well 114W is less than 3 nm, a small light emission area may be formed, thereby causing light loss. If the thickness T1 of the last quantum well 114WL is equal to or more than 15 nm, the quality may be degraded, thereby causing light loss.

Therefore, in the light emitting device 103 according to the third embodiment, the thickness T1 of the last quantum well 114WL is controlled to be thicker than the thickness T2 of the second quantum well 114W. Accordingly, an active area may be more widened in the last quantum well 114WL closest to the second conductivity type semiconductor layer 116 which emits most light.

According to the third embodiment, hole injection into the last quantum barrier 114BL closest to the second conductivity type semiconductor layer 116 may be maximized.

To this end, in the light emitting device 103 according to the third embodiment, the last quantum barrier 114BL is formed with a thickness B1 thinner than a thickness B2 of the second quantum barrier 114B.

The thickness B1 of the last quantum barrier 114BL may be in the range of about 30% to about 70% of the thickness B2 of the second quantum barrier 114B. If the thickness B1 of the last quantum barrier 114BL is less than 30%, the thickness B1 which is less than 30% may affect diffusion or electron blocking of Mg. If the thickness B1 of the last quantum barrier 114BL exceeds 70%, hole injection may be lowered.

Accordingly, in the light emitting device 103 according to the third embodiment, the thickness of the last quantum barrier 114BL is formed with a thickness thinner than another second quantum barrier 114B. Accordingly, hole injection into the last quantum barrier 114BL closest to the second conductivity type semiconductor layer 116 may be maximized, thereby improving light emission efficiency.

TABLE 2

|  | Light intensity (Po, mW) | Operating voltage (VF3, V) |
| --- | --- | --- |
| Comparative example | 498.0 | 3.61 |
| Third embodiment | 518.8 | 3.60 |

According to the third embodiment, when comparing with the comparative example, the operating voltage is maintained and light intensity is significantly improved.

In the light emitting device 103 according to the third embodiment, an active area may be more widened in the last quantum well 114WL closest to the second conductivity type semiconductor layer 116 which emits most light. In addition, the bandgap energy is controlled such that the light emitted from the last quantum well 114WL is not absorbed into another quantum well. Further, to maximize the hole injection into the last quantum barrier 114BL closest to the second conductivity type semiconductor layer 116, the thickness of the last quantum barrier 114B may be formed with a thickness thinner than that of another quantum barrier.

Figure 7:
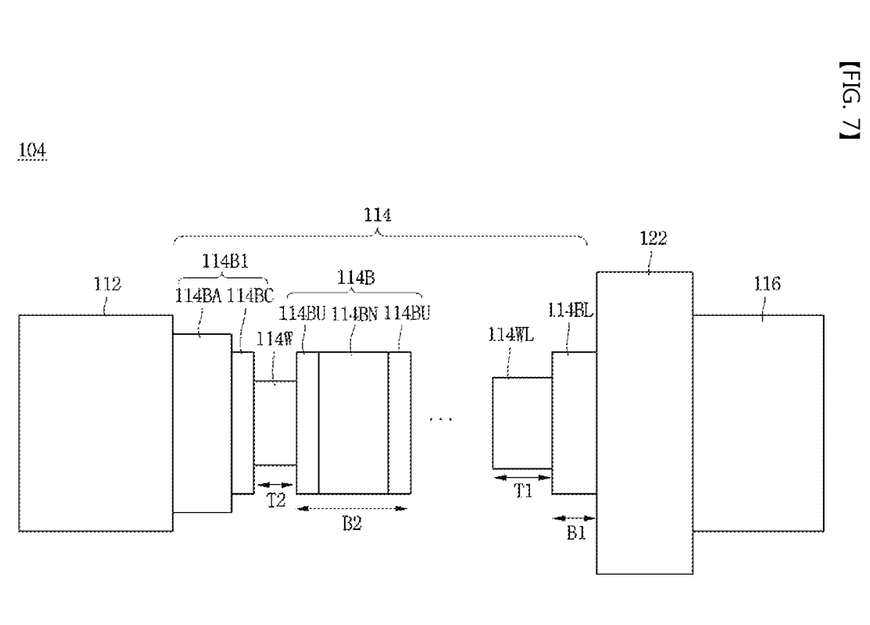
FIG. 7 is a band diagram of a light emitting device according to a fourth embodiment.

FIG. 7 is a band diagram of a light emitting device according to a fourth embodiment.

The fourth embodiment may employ the technical features of the first embodiment, the second embodiment, or the third embodiment.

For example, according to the fourth embodiment, a light emitting device 104 includes a first conductivity type semiconductor layer 112, an active layer 114 including a quantum barrier 114B and a quantum well 114W and provided on the first conductivity type semiconductor layer 116, and a second conductivity type semiconductor layer 116 on the active layer 114. The quantum wall 114B may include an undoped $Al_xGa_{1-x}N$ layer ($0 \leq x \leq 1$) 114BU and an N type $Al_yGa_{1-y}N$ ($0 \leq y \leq 1$) 114BN, and a first quantum barrier 114B1 closest to the first conductive semiconductor 112.

In the quantum barrier 114B, the undoped $Al_xGa_{1-x}N$ layers 114BU are provided at both sides of the N type $Al_yGa_{1-y}N$ layer 114BN. The quantum well 114W may include a last quantum well 114WL closest to the second conductivity type semiconductor layer 116 and a second quantum well 114W which is any one of quantum wells which are not closest to the second conductivity type semiconductor layer 116.

For example, according to the embodiment, the quantum barriers 114B may include the structure of the undoped $Al_xGa_{1-x}N$ layer 114BU/N type $Al_yGa_{1-y}N$ layer 114BN/undoped $Al_xGa_{1-x}N$ layer 114BU. As the efficiency of carrier injection into the last quantum well, which emits most light, is improved, the light intensity Po and the operating voltage VF3 may be improved.

The first quantum barrier 114B1 may include an N type $Al_pGa_{1-p}N$ layer ($0 \leq p \leq 1$) 114BA and an undoped $Al_qGa_{1-q}N$ layer ($0 \leq q \leq 1$) 114BC. In this case, the Al concentration (p) of the N type $Al_pGa_{1-p}N$ layer 114BA may be equal to or more than that the Al concentration (q) of the undoped $Al_qGa_{1-q}N$ layer 114BC.

For example, the Al concentration (p) of the N type $Al_pGa_{1-p}N$ layer 114BA may be more than the Al concentration (q) of the undoped $Al_qGa_{1-q}N$ layer 114BC. The Al concentrations of both layers may be controlled to satisfy $0.07 \leq q < p \leq 0.2$. More particularly, if the Al concentrations satisfy $0.1 \leq q < p \leq 0.18$, a more excellent effect may be produced, but various concentration ranges may be used.

Meanwhile, if the Al concentration (p) of the N type $Al_pGa_{1-p}N$ layer 114BA is less than the Al concentration (q) of the undoped $Al_qGa_{1-q}N$ layer 114BC, a current spreading effect may be degraded. If the Al concentration (q) of the undoped $Al_qGa_{1-q}N$ layer 114BC is less than 0.07, the current spreading effect may be degraded. If the Al concentration (p) of the N type $Al_pGa_{1-p}N$ layer exceeds 0.2, the efficiency of carrier injection may be degraded, thereby increasing the operating voltage VF3 and causing the light loss.

The thickness T1 of the last quantum well 114WL may be thicker than the thickness T2 of the second quantum well 114W. The relation between the thickness T1 of the last quantum well 114WL and the thickness T2 of the second quantum well 114W satisfy 3 nm≤T2<T1<15 nm. In detail, the relation of the thickness of 7 nm≤T2<T1<12 nm may be more effective.

If the thickness T2 of the second quantum well 114W is less than 3 nm, a small light emission area may be formed, thereby causing light loss. If the thickness T1 of the last quantum well 114WL is equal to or more than 15 nm, the quality may be degraded, thereby causing light loss.

Therefore, in the light emitting device 103 according to the embodiment, the thickness T1 of the last quantum well 114WL is controlled to be thicker than the thickness T2 of the second quantum well 114W. Accordingly, an active area may be more widened in the last quantum well 114WL closest to the second conductivity type semiconductor layer 116 which emits most light.

The last quantum well 114WL may include the composition of an $In_rGa_{1-r}N$ layer ($0 \leq r \leq 1$), and the second quantum well 114W may include the composition of an $In_sGa_{1-s}N$ layer ($0 \leq s \leq 1$). The In concentration (r) of the last quantum well 114WL may be higher than the In concentration (s) of the second quantum well 114W.

The In compositions of the last quantum well 114WL and the second quantum well 114W may be in the range of $0 \leq r < s < 0.015$. In more detail, the In composition (r) of the last quantum well 114WL may be in the range of $0.005 \leq r \leq 0.007$, and the In composition (s) of the second quantum well 114W may be in the range of $0.01 \leq s \leq 0.015$, but the embodiment is not limited thereto.

If the In composition(s) of the second quantum well 114W exceeds 0.015, a dual peak may occur or the wavelength may be increased to more than 370 nm. If In composition (r) of the last quantum well 114WL is equal to the In composition (s) of the second quantum well 114W, the light emitted from the last quantum well 114WL may be absorbed into another quantum well, thereby causing light loss.

Therefore, in the light emitting device 103 according to the embodiment, bandgap energy may be controlled such that the light emitted from the last quantum well 114WL is not absorbed into another quantum well.

Hereinafter, a method of fabricating a light emitting device according to the embodiment will be described with reference to FIGS. 8 to 10.

Figure 8:
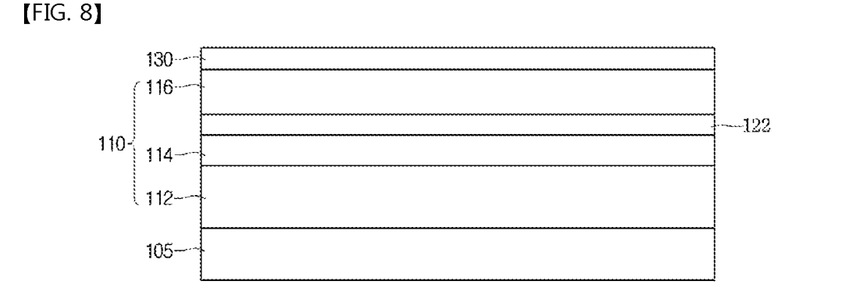
FIGS. 8 to 10 are cross-sectional views showing processes in a method of fabricating a light emitting device according to the embodiment.

First, as shown in FIG. 8, a substrate 105 is prepared. The substrate 105 may be formed of a material having excellent thermal conductivity. The substrate 105 may include a conductive substrate or an insulating substrate.

For example, the substrate 105 may include at least one of sapphire ($Al_2O_3$), SiC, Si, GaAs, GaN, ZnO, GaP, InP, Ge, and $Ga_2O_3$. A concavo-convex structure may be formed on the substrate 105. The sectional surface of the concavo-convex structure may be in a circular shape, an oval shape, or a polygonal shape, but the embodiment is not limited thereto.

In this case, a buffer layer may be formed on the substrate 105. The buffer layer may reduce the lattice mismatch between a material of a light emitting structure 110, which is to be formed thereafter, and the substrate 105. The material of the buffer layer may include at least one of group III-V compound semiconductors, for example, GaN, InN, AlN, InGaN, AlGaN, InAlGaN, and AlInN.

Next, the light emitting structure 110 including a first conductivity type semiconductor layer 112, an active layer 114, and a second conductive semiconductor 116 may be formed on the first substrate 105.

The first conductivity type semiconductor layer 112 may be formed of a semiconductor compound, and may be realized with a group II-VI compound semiconductor or a group III-V compound semiconductor. The first conductivity type semiconductor layer 112 may be doped with dopants. If the first conductivity type semiconductor layer 112 is an N type semiconductor layer, the first conductive dopant may include Si, Ge, Sn, Se, or Te serving as an N type dopant, but the embodiment is not limited thereto.

The first conductivity type semiconductor layer 112 may include a semiconductor material having a composition formula of $In_xAl_yGa_{1-x-y}N$ ($0 \leq x \leq 1$, $0 \leq y \leq 1$, $0 \leq x+y \leq 1$).

The first conductivity type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 114 may have one of a single quantum well (SQW) structure, a multi-quantum well (MQW) structure, a quantum wire structure, and a quantum dot structure. For example, the active layer 114 may have the MQW structure formed by injecting trimethyl gallium (TMGa) gas, ammonia ($NH_3$) gas, nitrogen ($N_2$) gas, and trimethyl indium (TMIn) gas, but is not limited thereto.

The active layer 114 may have the structure of the quantum well 114W/the quantum barrier 114B. For example, the active layer 114 may have at least one of pair structures including AlGaN/AlGaN, InGaN/GaN, InGaN/InGaN, GaN/AlGaN, InGaN/AlGaN, InAlGaN/GaN, GaAs/

AlGaAs, InGaAs/AlGaAs, GaP/AlGaP, and InGaP/AlGaP, but the embodiment is not limited thereto.

The active layer 114 may employ a technical feature of the first embodiment to the fourth embodiment described above.

For example, the quantum barrier 114B of the active layer 114 may include the undoped $Al_xGa_{1-x}N$ layer (0≤x≤1) 114BU and the N type $Al_yGa_{1-y}N$ layer (0≤y≤1) 114BN and a first quantum barrier 114B1 closest to the first conductivity type semiconductor layer 112.

In the quantum barrier 114B, the undoped $Al_xGa_{1-x}N$ layers 114BU are provided at both sides of the N type $Al_yGa_{1-y}N$ layer 114BN. A quantum well 114W may include a last quantum well 114WL closest to the second conductivity type semiconductor layer 116 and a second quantum well 114W which is any one of quantum wells which are not closest to the second conductivity type semiconductor layer 116.

According to the embodiment, the quantum barriers 114B may include the structure of the undoped $Al_xGa_{1-x}N$ layer 114BU/N type $Al_yGa_{1-y}N$ layer 114BN/undoped $Al_xGa_{1-x}N$ layer 114BU. As the efficiency of carrier injection into the last quantum well, which emits most light, is improved, the light intensity Po and the operating voltage VF3 may be improved.

The first quantum barrier 114B1 may include an N type $Al_pGa_{1-p}N$ layer 114BA and an undoped $Al_qGa_{1-q}N$ layer (0≤q≤1) 114BC. In this case, the Al concentration (p) of the N type $Al_pGa_{1-p}N$ layer 114BA may be equal to or more than that the Al concentration (q) of the undoped $Al_qGa_{1-q}N$ layer 114BC.

The thickness T1 of the last quantum well 114WL may be thicker than the thickness T2 of the second quantum well 114W. The relation between the thickness T1 of the last quantum well 114WL and the thickness T2d of the second quantum well 114W satisfy 3 nm≤T2<T1<15 nm. In detail, the relation of the thickness of 7 nm≤T2<T1<12 nm may be more effective.

Therefore, in the light emitting device 103 according to the embodiment, the thickness T1 of the last quantum well 114WL is controlled to be thicker than the thickness T2 of the second quantum well 114W. Accordingly, an active area may be more widened in the last quantum well 114WL closest to the second conductivity type semiconductor layer 116 which emits most light.

The last quantum well 114WL may include the composition of an $In_rGa_{1-r}N$ layer (0≤r≤1), and the second quantum well 114W may include the composition of an $In_sGa_{1-s}N$ layer (0≤s≤1). The indium (In) concentration (r) of the last quantum well 114WL may be higher than the indium (In) concentration (s) of the second quantum well 114W. Therefore, in the light emitting device 103 according to the embodiment, bandgap energy may be controlled such that the light emitted from the last quantum well 114WL is not absorbed into another quantum well.

Next, as shown in FIG. 8, an $Al_pGa_qIn_{1-p-q}N$ layer (0<p≤1, 0≤q≤1) 122 is formed on the active layer 114 to have an energy bandgap higher than that of the active layer 114, thereby performing an electron blocking function and an MQW cladding function, so that the light emission efficiency may be improved.

The second conductivity type semiconductor layer 116 may be formed on the $Al_pGa_qIn_{1-p-q}N$ layer 122. The second conductivity type semiconductor layer 116 may include a semiconductor material having a composition formula of $In_xAl_yGa_{1-x-y}N$ (0≤x≤1, 0≤y≤1, 0≤x+y≤1). If the second conductivity type semiconductor layer 116 is a P type semiconductor layer, a second conductive dopant may include Mg, Zn, Ca, Sr, or Ba such as a P type dopant.

Although the embodiment has been described in that the first conductivity type semiconductor layer 112 includes an N type semiconductor layer, and the second conductivity type semiconductor layer 116 includes a P type semiconductor layer, the first conductivity type semiconductor layer 112 may be realized with the P type semiconductor layer, and the second conductivity type semiconductor layer 116 may be realized with the N type semiconductor layer. However, the embodiment is not limited thereto.

In addition, a semiconductor layer, such as an N type semiconductor layer (not shown) having polarity opposite to a second conductive type polarity, may be formed on the second conductivity type semiconductor layer 116. Accordingly, the light emitting structure 110 may include one of an N-P junction structure, a P-N junction structure, an N-P-N junction structure, and a P-N-P junction structure.

Thereafter, the second conductivity type semiconductor layer 116 may be formed thereon with a transmissive layer 130.

For example, the transmissive electrode 130 may include an ohmic layer. The transmissive layer 130 may be formed by laminating single metal or a metal alloy, metal oxide, and the like in a single layer or in a multi-layer such that hole injection may be efficiently performed.

For example, the transmissive layer 130 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

Figure 9:
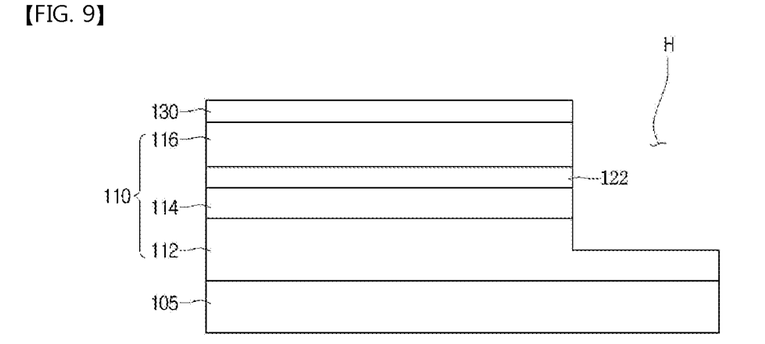

Thereafter, as shown in FIG. 9, an area H may be formed by removing portions of the transmissive electrode 130, the second conductivity type semiconductor layer 116, the $Al_pGa_qIn_{1-p-q}N$ layer 122, and the active layer 114 such that the first conductivity type semiconductor layer 112 is exposed.

Figure 10:
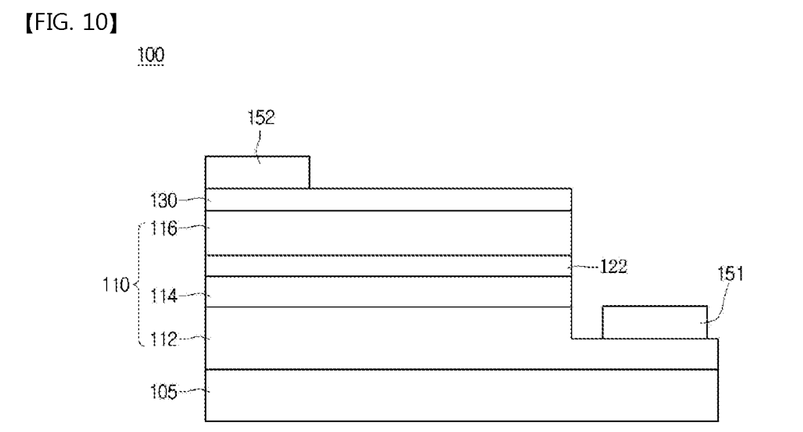

Then, as shown in FIG. 10, a second electrode 152 is formed on the transmissive electrode 130 and a first electrode 151 is formed on the exposed portion of the first conductivity type semiconductor layer 112, thereby forming the light emitting device according to the embodiment.

According to the embodiment, a plurality of light emitting devices may be arrayed in a package form on a substrate. In addition, a light guide plate, a prism sheet, a diffusion sheet, and a phosphorus sheet, which are optical members, may be provided on a path of light emitted from a light emitting device package.

Figure 11:
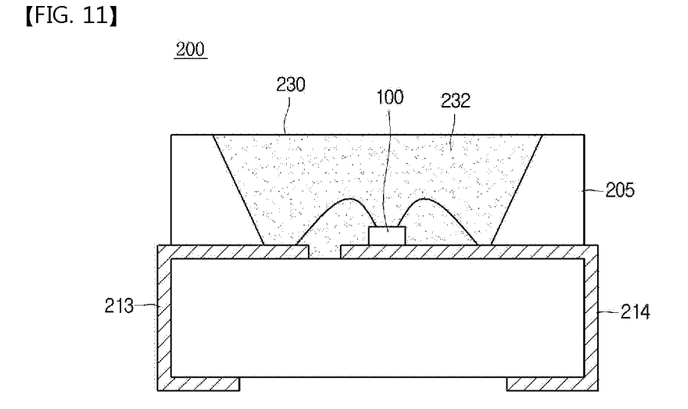
FIG. 11 is a cross-sectional view of a light emitting device package according to the embodiment.

For example, FIG. 11 is a sectional view showing a light emitting device package in which the light emitting device according to embodiments is mounted.

The light emitting device package according to the embodiment may include a package body part 205, third and fourth electrode layers 213 and 214 mounted on the package body part 205, a light emitting device 100 mounted on the package body part 205 and electrically connected with the third and fourth electrode layers 213 and 214, and a molding member 230 having phosphor 232 and surrounding the light emitting device 100. The molding member 230 has a flat, concavo, or convex top surface, but the embodiment is not limited thereto.

The third and fourth electrode layers 213 and 214 are electrically isolated from each other to supply power to the light emitting device 100. In addition, the third and fourth electrode layers 213 and 214 reflect light emitted from the light emitting device 100 to improve light efficiency, and discharge heat generated from the light emitting device 100 to an outside.

The light emitting device 100 may be electrically connected with the third electrode layer 213 and/or the fourth electrode layer 214 through one of a wire scheme, a flip-chip scheme and a die-bonding scheme.

According to the embodiment, the UV LED may be used for sterilizing, purifying, or the like, or the use for exposure machine, curing machine, or the like, but the embodiment is not limited thereto.

For example, according to the embodiment, the UV LED may be applied to a backlight unit, a lighting unit, a display device, an indicator, a vehicle display device, a vehicle lighting device, a smart watch, or the like, but the embodiment is not limited hereto.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An ultraviolet light emitting device comprising:
    a first conductivity type semiconductor layer;
    an active layer including a quantum barrier and a quantum well and provided on the first conductivity type semiconductor layer; and
    a second conductivity type semiconductor layer on the active layer,
    wherein the quantum barrier includes undoped $Al_xGa_{1-x}N$ layers ($0 \leq x \leq 1$) and a N type $Al_yGa_{1-y}N$ layer ($0 \leq y \leq 1$),
    wherein the quantum barrier comprises a structure including the N type $Al_yGa_{1-y}N$ layer disposed between a first undoped $Al_xGa_{1-x}N$ layer and a second undoped $Al_xGa_{1-x}N$ layer, and
    wherein the N type $Al_yGa_{1-y}N$ layer and the first and second undoped $Al_xGa_{1-x}N$ layers are free of indium.

2. The ultraviolet light emitting device of claim 1, wherein the N type $Al_yGa_{1-y}N$ layer includes a repeated structure of a u-$Al_aGa_{1-a}N$ layer ($0 \leq a \leq 1$)/n-$Al_bGa_{1-b}N$ layer ($0 \leq b \leq 1$).

3. The ultraviolet light emitting device of claim 1, wherein the undoped $Al_xGa_{1-x}N$ layer has an aluminum concentration (x) satisfying $0.1 \leq x \leq 0.2$.

4. The ultraviolet light emitting device of claim 1, wherein the undoped $Al_xGa_{1-x}N$ layer has a thickness ranging from 1 nm to 5 nm.

5. The ultraviolet light emitting device of claim 1, wherein the N type $Al_yGa_{1-y}N$ layer has an aluminum concentration (y) satisfying $0.05 \leq y \leq 0.2$.

6. The ultraviolet light emitting device of claim 1, wherein the N type $Al_yGa_{1-y}N$ layer has a thickness ranging from 1 nm to 15 nm.

7. The ultraviolet light emitting device of claim 1, wherein the quantum barrier includes a first quantum barrier near the first conductivity type semiconductor layer, and
    wherein the first quantum barrier includes an N type $Al_pGa_{1-p}N$ layer ($0 \leq p \leq 1$) and an undoped $Al_qGa_{1-q}N$ layer ($0 \leq q \leq 1$).

8. The ultraviolet light emitting device of claim 7, wherein the N type $Al_pGa_{1-p}N$ layer is closer to the first conductivity type semiconductor layer than the undoped $Al_qGa_{1-q}N$ layer is to the first conductivity type semiconductor layer.

9. The ultraviolet light emitting device of claim 7, wherein the N type $Al_pGa_{1-p}N$ layer has an aluminum (Al) concentration (p) which is equal to or higher than an Al concentration (q) of the undoped $Al_qGa_{1-q}N$ layer.

10. The ultraviolet light emitting device of claim 9, wherein the Al concentration (p) of the N type $Al_pGa_{1-p}N$ layer and the Al concentration (q) of the undoped $Al_qGa_{1-q}N$ layer have a relation satisfying $0.07 \leq q < p \leq 0.2$.

11. The ultraviolet light emitting device of claim 7, wherein an Al concentration of the N type $Al_pGa_{1-p}N$ layer is higher than an Al concentration of the undoped $Al_qGa_{1-q}N$ layer.

12. The ultraviolet light emitting device of claim 1, wherein the quantum well includes:
    a last quantum well closest to the second conductivity type semiconductor layer; and
    a second quantum well that is one of quantum wells which are not be closest to the second conductivity type semiconductor layer, and
    wherein the last quantum well has a thickness thicker than a thickness of the second quantum barrier.

13. The ultraviolet light emitting device of claim 12, wherein the last quantum well has a composition of an $In_rGa_{1-r}N$ layer ($0 \leq r \leq 1$) and the second quantum well has a composition of an $In_sGa_{1-s}N$ layer ($0 \leq s \leq 1$), and
    wherein an indium (In) concentration (r) of the last quantum well is greater than an indium (In) concentration (s) of the second quantum well.

14. The ultraviolet light emitting device of claim 12, wherein the last quantum barrier has a thickness thinner than a thickness of the second quantum barrier.

15. A light emitting device package including the ultraviolet light emitting device according to claim 1.

* * * * *